US012574045B2

(12) United States Patent
Melanson et al.

(10) Patent No.: US 12,574,045 B2
(45) Date of Patent: \*Mar. 10, 2026

(54) FINITE IMPULSE RESPONSE INPUT DIGITAL-TO-ANALOG CONVERTER

(71) Applicant: Cirrus Logic International Semiconductor Ltd., Edinburgh (GB)

(72) Inventors: John L. Melanson, Austin, TX (US); Lingli Zhang, Austin, TX (US); Paul M. Astrachan, Austin, TX (US); James Kelton, Austin, TX (US)

(73) Assignee: Cirrus Logic Inc., Austin, TX (US)

( \* ) Notice: Subject to any disclaimer, the term of this patent is extended or adjusted under 35 U.S.C. 154(b) by 54 days.

This patent is subject to a terminal disclaimer.

(21) Appl. No.: 18/654,911

(22) Filed: May 3, 2024

(65) Prior Publication Data

US 2024/0291501 A1 Aug. 29, 2024

Related U.S. Application Data

(63) Continuation-in-part of application No. 17/980,146, filed on Nov. 3, 2022, now Pat. No. 12,009,829.

(Continued)

(51) Int. Cl.
*H03M 1/82* (2006.01)
*H03M 1/18* (2006.01)
(Continued)

(52) U.S. Cl.
CPC ........... *H03M 1/822* (2013.01); *H03M 1/183* (2013.01); *H03M 1/06* (2013.01); *H03M 1/1023* (2013.01)

(58) Field of Classification Search
CPC ........ H03M 1/822; H03M 1/183; H03M 1/06; H03M 1/0607; H03M 1/1023; H03M 1/0626
See application file for complete search history.

(56) References Cited

U.S. PATENT DOCUMENTS

| 6,967,607 B2 | 11/2005 | Melanson |
| 7,209,067 B1 | 4/2007 | Melanson |

(Continued)

FOREIGN PATENT DOCUMENTS

WO 2023081296 A1 5/2023

OTHER PUBLICATIONS

International Search Report and Written Opinion of the International Searching Authority, International Application No. PCT/US2025/023167, mailed Jul. 3, 2025.

(Continued)

*Primary Examiner* — Joseph J Lauture
(74) *Attorney, Agent, or Firm* — Jackson Walker L.L.P.

(57) ABSTRACT

A digital-to-analog converter (DAC) may include an integrator, an input network, and control circuitry. The input network may include a plurality of parallel taps, each having a signal delay such that at least two of the signal delays of the members of the plurality of parallel taps are different, and wherein each member is coupled between an input of the digital-to-analog converter and an input of the integrator. The control circuitry may be configured to selectively enable and disable particular members of the plurality of parallel taps in order to program an effective input resistance of the input network to control an analog gain of the DAC, such that the control circuitry enables, substantially contemporaneously, an even number of members at a time in order to increase the analog gain, with half of such enabled members in a first group and half of such enabled members in a second group.

8 Claims, 9 Drawing Sheets

Related U.S. Application Data

(60) Provisional application No. 63/277,812, filed on Nov. 10, 2021, provisional application No. 63/275,161, filed on Nov. 3, 2021.

(51) Int. Cl.
   *H03M 1/06*    (2006.01)
   *H03M 1/10*    (2006.01)

(56)                References Cited

U.S. PATENT DOCUMENTS

| | | |
|---|---|---|
| 7,429,940 B2 | 9/2008 | Melanson |
| 12,009,829 B2 * | 6/2024 | Melanson ............... H03M 1/06 |
| 2014/0062745 A1 | 3/2014 | Kinyua et al. |

OTHER PUBLICATIONS

International Search Report and Written Opinion of the International Searching Authority, International Application No. PCT/US2022/048846, mailed Mar. 9, 2023.

* cited by examiner

AMPLITUDE $t_1$          TIME          $t_2$

AMPLITUDE

TAPS ADDED $t_1$          TIME          $t_2$

FINITE IMPULSE RESPONSE INPUT DIGITAL-TO-ANALOG CONVERTER

RELATED APPLICATION

The present disclosure claims priority as a continuation-in-part to U.S. patent application Ser. No. 17/980,146, filed Nov. 3, 2022, now U.S. Pat. No. 12,009,829, which in turn claims priority to U.S. Provisional Patent Application Ser. No. 63/275,161, filed Nov. 3, 2021, and U.S. Provisional Patent Application Ser. No. 63/277,812, filed Nov. 10, 2021, all of which are incorporated by reference herein in their entireties.

FIELD OF DISCLOSURE

The present disclosure relates in general to circuits for electronic devices, including without limitation personal audio devices such as wireless telephones and media players, and more specifically, to a digital-to-analog converter (DAC) with embedded minimal error adaptive slope compensation for a digital peak current controlled switched mode power supply.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers. Such circuitry often includes a digital-to-analog converter (DAC) for converting a digital audio signal into a corresponding analog audio signal, which may be amplified and driven to a loudspeaker or other audio transducer.

For example, in traditional approaches, a digital signal may comprise a pulse-width modulated (PWM) signal to which an analog gain is applied using a serial string of resistors having appropriate tap points in order to provide a desired input resistance. However, in this type of approach, no filtering of the digital input signal may occur because it is a binary signal and such approach does not support a multi-level signal that is typically required for filtered data.

SUMMARY

In accordance with the teachings of the present disclosure, one or more disadvantages and problems associated with existing approaches to converting a digital PWM signal to an analog signal may be reduced or eliminated.

In accordance with embodiments of the present disclosure, a digital-to-analog converter may include an integrator, an input network, and control circuitry. The input network may include a plurality of parallel taps, each member of the plurality of parallel taps having a signal delay such that at least two of the signal delays of the members of the plurality of parallel taps are different, and wherein each member of the plurality of parallel taps is coupled between an input of the digital-to-analog converter and an input of the integrator. The control circuitry may be configured to selectively enable and disable particular members of the plurality of parallel taps in order to program an effective input resistance of the input network to control an analog gain of the digital-to-analog converter, such that the control circuitry enables, substantially contemporaneously, an even number of members at a time in order to increase the analog gain, with half of such enabled members in a first group and half of such enabled members in a second group.

In accordance with these and other embodiments of the present disclosure, a method may be provided for a digital-to-analog converter having an integrator and an input network comprising a plurality of parallel taps, each member of the plurality of parallel taps having a signal delay such that at least two of the signal delays of the members of the plurality of parallel taps are different, and wherein each member of the plurality of parallel taps is coupled between an input of the digital-to-analog converter and an input of the integrator. The method may include selectively enabling and disabling, substantially contemporaneously, particular members of the plurality of parallel taps in order to program an effective input resistance of the input network to control an analog gain of the digital-to-analog converter, such an even number of members are enabled at a time in order to increase the analog gain, with half of such enabled members in a first group and half of such enabled members in a second group.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
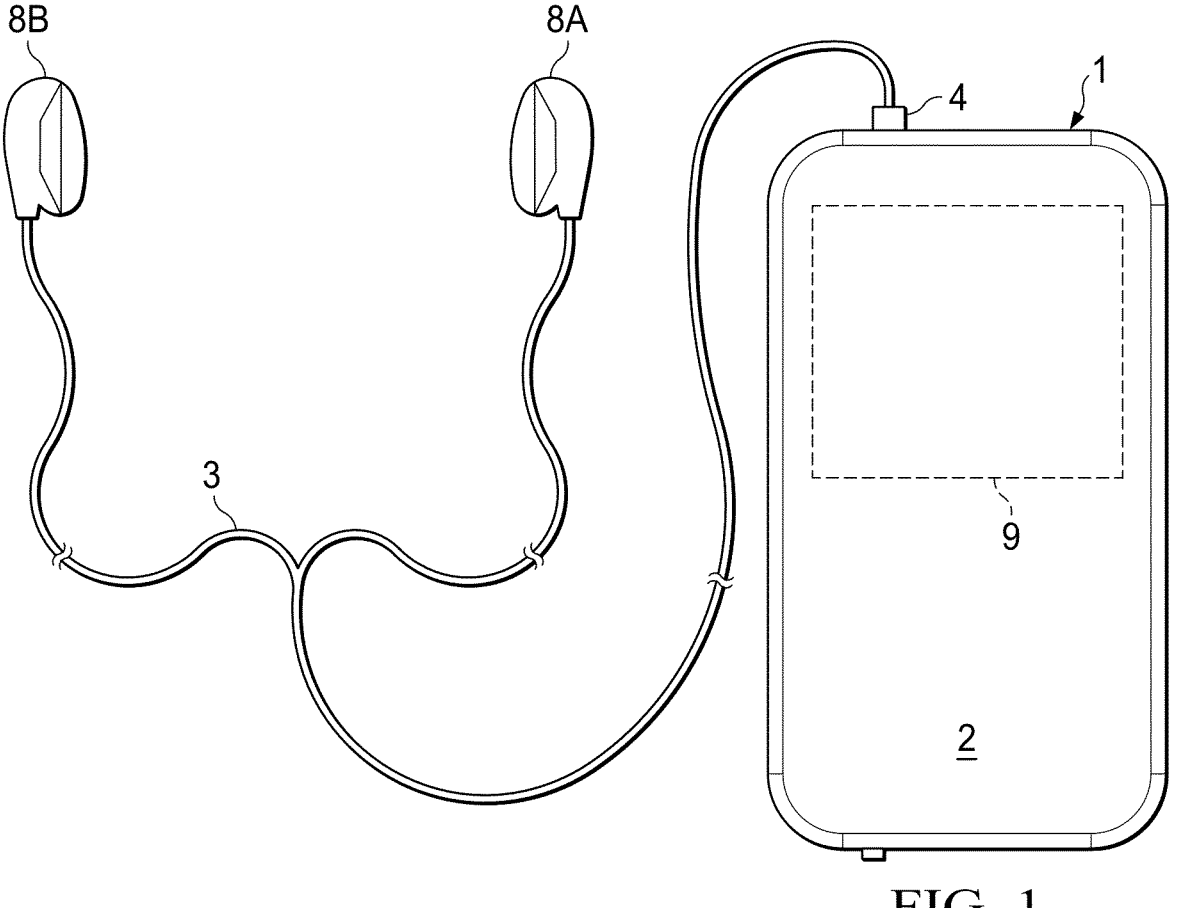
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
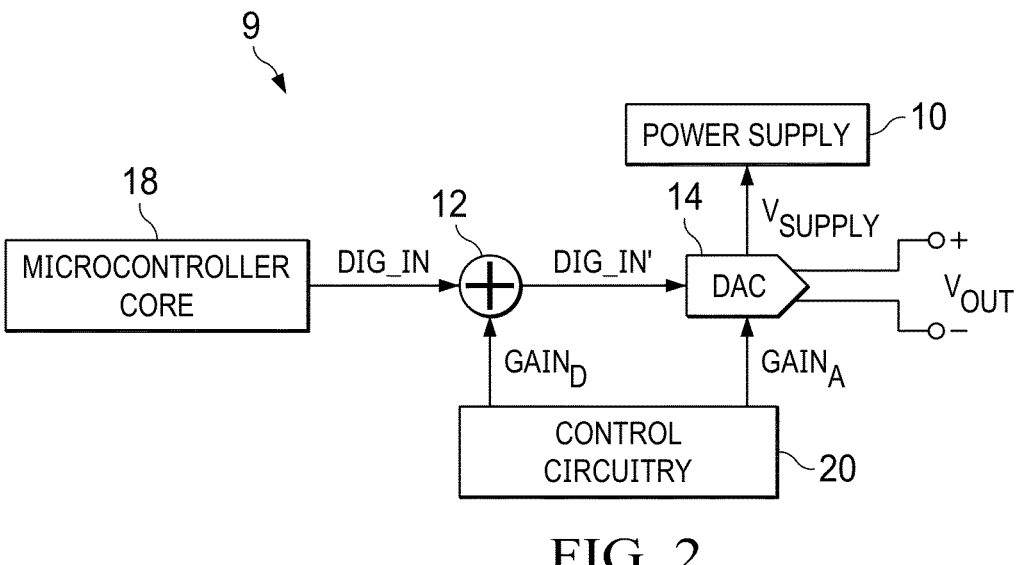
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital input signal DIG_IN to a digital gain element 12 which may apply a digital gain $GAIN_D$ to digital input signal DIG_IN in order to generate modified digital input signal DIG_IN' to digital-to-analog converter (DAC) 14. DAC 14 may convert modified digital input signal DIG_IN' to an analog differential output signal $V_{OUT}$. In some embodiments, DAC 14 may be configured to apply an analog gain $GAIN_A$ to amplify or attenuate modified digital input signal DIG_IN' to provide differential output signal $V_{OUT}$, which may operate a speaker, a headphone transducer, a line level signal output, other transducer, and/or other suitable output. Thus, together digital gain $GAIN_D$ and analog gain $GAIN_A$, either or both of which may be programmable, may apply a desired overall gain (e.g., $GAIN_D \cdot GAIN_A$) to digital input signal DIG_IN in order to generate differential output signal $V_{OUT}$. A power supply 10 may provide the power supply rail inputs of DAC 14. As shown in FIG. 2, audio IC 9 may include control circuitry 20 configured to control digital gain $GAIN_D$ and analog gain $GAIN_A$, as described in greater detail below.

Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, including without limitation an automobile, a building, or other structure. Further, a DAC such as DAC 14 may be used in other applications besides audio processing and generating audio signals, including without limitation generating analog signals for other transducers, including without limitation haptic transducers.

Figure 3:
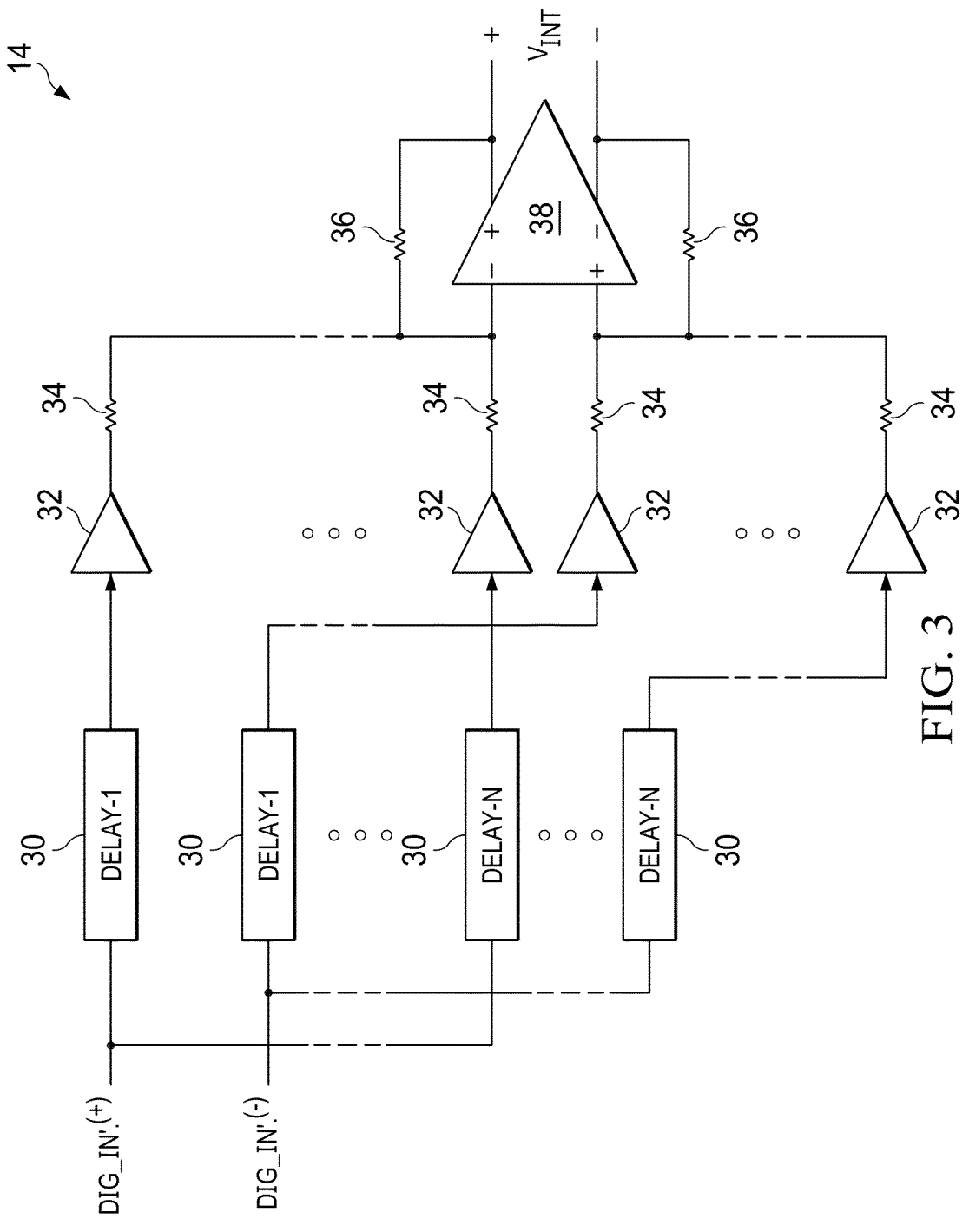
FIG. 3 illustrates an example circuit diagram of selected components of a digital-to-analog converter, in accordance with embodiments of the present disclosure.

FIG. 3 illustrates an example circuit diagram of selected components of DAC 14, in accordance with embodiments of the present disclosure. As shown in FIG. 3, DAC 14 may receive a differential modified digital input signal DIG_IN' having a first polarity signal DIG_IN'$^{(+)}$ and a second polarity signal DIG_IN'$^{(-)}$, such that DIG_IN'=DIG_IN'$^{(+)}$–DIG_IN'$^{(-)}$. In some embodiments, each of first polarity signal DIG_IN'$^{(+)}$ and second polarity signal DIG_IN'$^{(-)}$ may comprise PWM signals. Further, DAC 14 may include a plurality of parallel taps arranged in pairs such that one input of each tap pair receives first polarity signal DIG_IN'$^{(+)}$ and the other input of such tap pair receives second polarity signal DIG_IN'$^{(-)}$. Each tap may include a delay element 30 that adds a signal delay of a defined duration, a buffer 32 for buffering the delayed signal, and an input resistor 34, with a terminal of each input resistor 34 of taps receiving first polarity signal DIG_IN'$^{(+)}$ coupled together at an inverting input of an integrator 38 and a terminal of each input resistor 34 of taps receiving second polarity signal DIG_IN'$^{(-)}$ coupled together at a non-inverting input of integrator 38. A feedback resistor 36 may be coupled between an inverting output of and a non-inverting input of integrator 38 and another feedback resistor 36 may be coupled between a non-inverting output of and an inverting input of integrator 38. As a result, integrator 38 may generate an analog integrator output signal $V_{INT}$ that may be further processed by other components of DAC 14 (not explicitly shown, but may include one or more loop filters, modulators, driving output stages, etc.) to generate analog output voltage $V_{OUT}$.

As seen in FIG. 3, the serial string of resistors used in traditional approaches, as described in the Background section above, may be replaced with a parallel combination of gain taps, each gain tap including parallel fixed value input resistors 34. Although not explicitly shown in FIG. 3 for purposes of clarity and exposition, each gain tap may be selectively enabled or disabled (e.g., by control circuitry 20), such that input resistance, and accordingly analog gain of DAC 14, may be programmed by enabling between 1 and N parallel taps, wherein N is the number of taps available. For example, assuming each input resistor 34 has a resistance of $R_I$ (although in some embodiments, resistances of input resistors 34 may vary significantly) and feedback resistors 36 have a resistance of $R_F$, an analog gain $GAIN_A$ in decibels for DAC 14 may be given by:

$$GAIN_A = 20\log\frac{n \cdot R_F}{R_I}$$

where n represents the number of the N taps that are enabled. As a specific example, further assuming N=10 total taps and $R_F$=$R_I$, the relationship among the number of taps n which are enabled to $GAIN_A$ may be given by the table below:

| Taps | 1 | 2 | 3 | 4 | 5 | 6 | 7 | 8 | 9 | 10 |
|---|---|---|---|---|---|---|---|---|---|---|
| Gain(dB) | 0 | 6.02 | 9.54 | 12.04 | 13.98 | 15.56 | 16.90 | 18.06 | 19.08 | 20.00 |

Accordingly, a desired gain may be provided by tuning feedback resistors 36 and/or the combination of enabled parallel gain taps to result in an appropriate gain for a given application. If needed, gains may further be manipulated by tuning (e.g., by control circuitry 20) digital gain $GAIN_D$ as appropriate to achieve a desired overall gain. For example, if a gain of 10 dB were desired, four taps of DAC 14 may be enabled to provide analog $GAIN_A$ of 12.04 dB and digital gain $GAIN_D$ may be tuned to apply an attenuation of 2.04 dB to result in an overall path gain of 10 dB.

In addition to generating a desired analog gain by selectively enabling and disabling the various parallel taps of DAC 14, selectively enabling and disabling the various parallel taps of DAC 14, assuming delay elements 30 are of different duration between different pairs of taps, may in effect implement a hybrid analog/digital finite impulse response (FIR) filter with desired filter characteristics (e.g., desired filter nulls) by taking advantage of the summing nodes present at the inputs of integrator 38.

Figure 4:
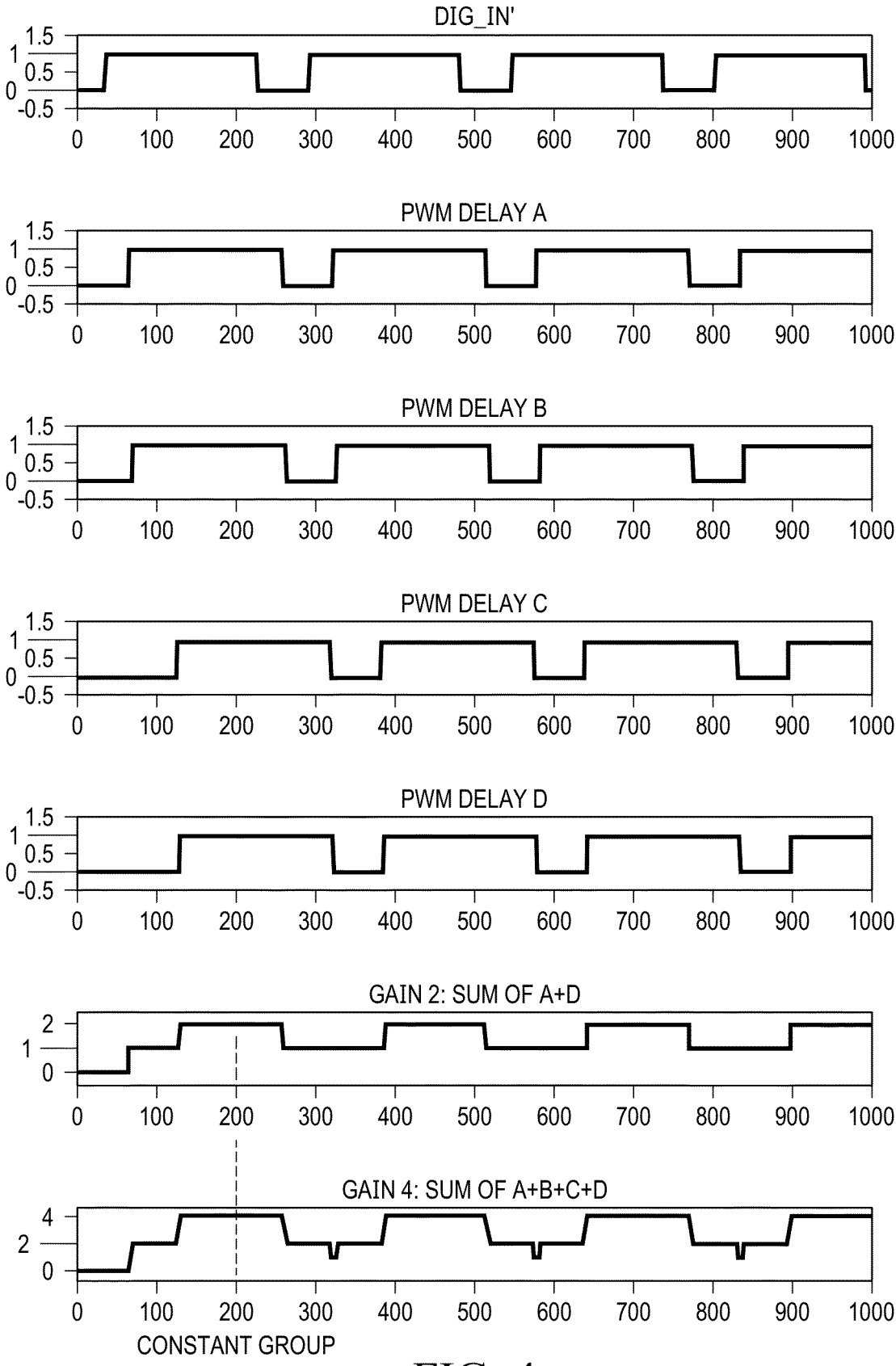
FIG. 4 illustrates an example of generation of analog gain by delaying and summing the various delayed PWM signals through each of parallel gain taps of a digital-to-analog converter, in accordance with embodiments of the present disclosure.

FIG. 4 illustrates an example of generation of analog gain $GAIN_A$ by delaying and summing the various delayed PWM signals through each of the taps of DAC 14, in accordance with embodiments of the present disclosure. FIG. 4 depicts a modified digital analog signal DIG_IN' with delays of durations A, B, C, and D applied by delay elements 30 of different gain taps. FIG. 4 further shows the summation of two of the delayed signals and summation of all four of the delayed signals. As seen in FIG. 4, the group delay between the two summed PWM signals are the same, and the gain is increased by two for the sum of the four delayed signals as compared to the sum of two delayed signals.

Figure 5A:
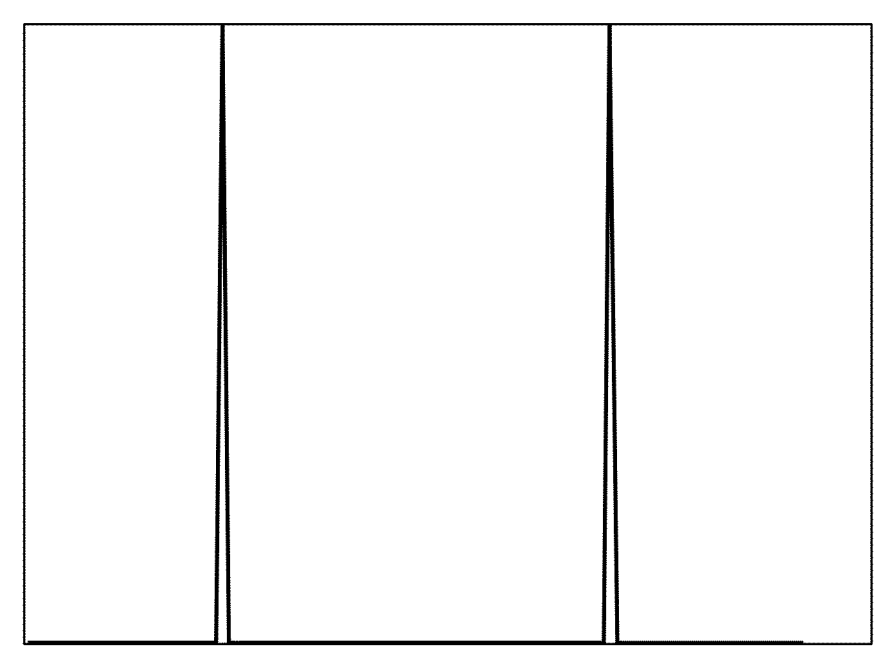
FIGS. 5A and 5B illustrate examples of a filter that may be implemented by enabling two pairs of parallel gain taps of a digital-to-analog converter, in accordance with embodiments of the present disclosure.
Figure 5B:
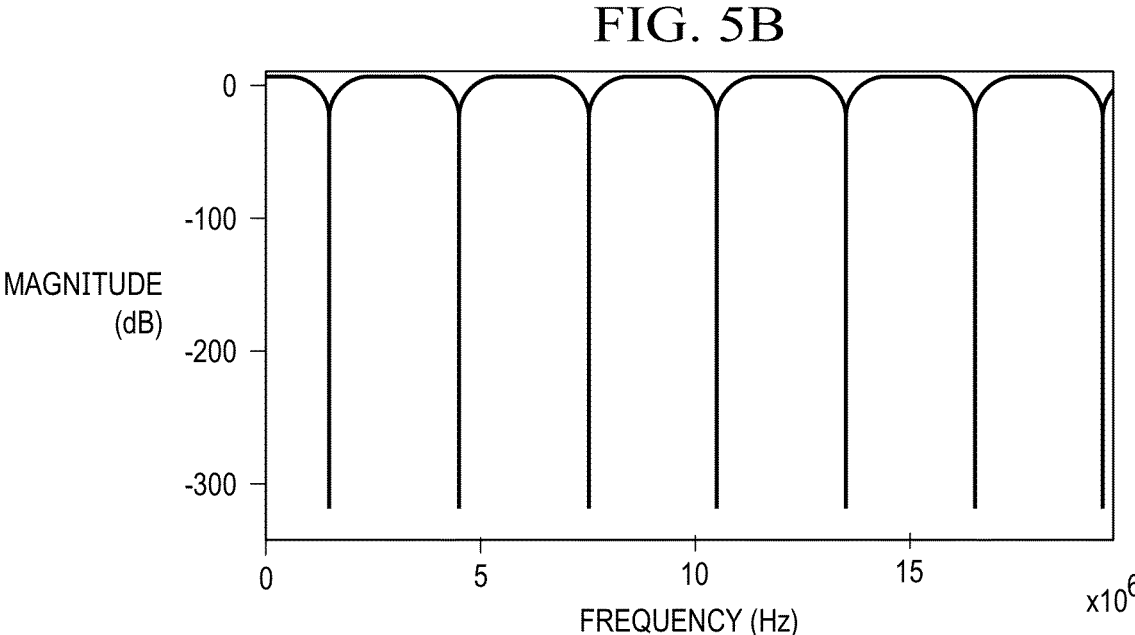
Figures 6A, 6B:
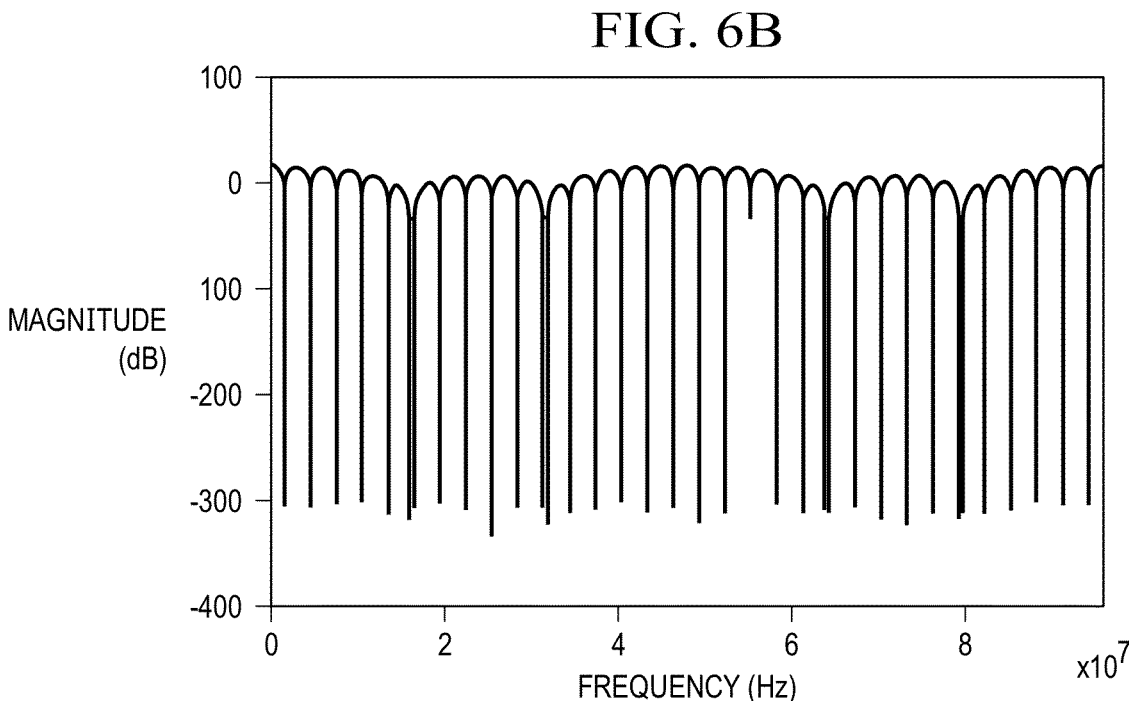
FIGS. 6A and 6B illustrate examples of a filter that may be implemented by enabling six pairs of parallel gain taps of a digital-to-analog converter, in accordance with embodiments of the present disclosure.

Thus, as described above, both control of gain and filter characteristics of DAC 14 may be achieved by selectively enabling and disabling parallel gain taps of DAC 14. As an example, by enabling two pairs of taps, a filter represented in the time-domain by the impulse response function of FIG. 5A and with a frequency-domain representation represented by FIG. 5B may be implemented. As another example, by enabling six pairs of taps, a filter represented in the time-domain by the impulse response function of FIG. 6A and with a frequency-domain representation represented by FIG. 6B may be implemented.

In order to minimize signal artifacts (e.g., "pops" and "clicks" that may occur in audio applications) resulting from enabling and disabling of taps of DAC 14, control circuitry 20 for enabling and disabling taps of DAC 14 may be configured to enable and disable taps at points of time in which signal artifacts may be avoided. For example, assume a tap pair delays a data symbol by a period of time t. By delaying a control signal for enabling or disabling the tap pair by time t from the start of the symbol (which may always be zero), the tap pair may too be enabled or disabled when the data associated with such tap is also zero. In an alternative implementation, a tap pair may be enabled or disabled when its input data is "1" if desired. Thus, control circuitry 20 may be configured to sequence control signals for enabling and disabling each tap pair of DAC 14 based on a delay added to modified digital input signal DIG_IN' by such tap pair, so as to enable only when both polarities of the delayed signal as delayed by delay elements 30 are zero or "1", as desired.

Choices for the hybrid analog/digital FIR structure described above with respect to FIG. 3 may play a role in both filtering and matching of the input waveform and output of a multiple level output stage (or other component downstream of DAC 14), as well as minimize integrated crosstalk noise, integrator dynamic range, and total harmonic distortion noise.

In accordance with embodiments of the present disclosure, as control circuitry 20 increases the number of parallel gain taps to increase gain, control circuitry 20 may enable an even number of tap pairs at a time, with half of such enabled tap pairs in a first group and half of such enabled tap pairs in a second group, wherein the first group and the second group are separated temporally from each other in order to facilitate matching of input and output waveforms. Accordingly, when enabling additional tap pairs, control circuitry 20 may enable a tap pair for each of the first group and the second group, and when disabling tap pairs, may disable a tap pair from each of the first group and the second group. Furthermore, when enabling (or disabling) additional tap pairs, control circuitry 20 may enable (or disable) tap pairs at tap locations by alternating between tap locations that decrease duration between the centers of each tap group and tap locations that increase duration between the centers of each tap group.

Figure 7:
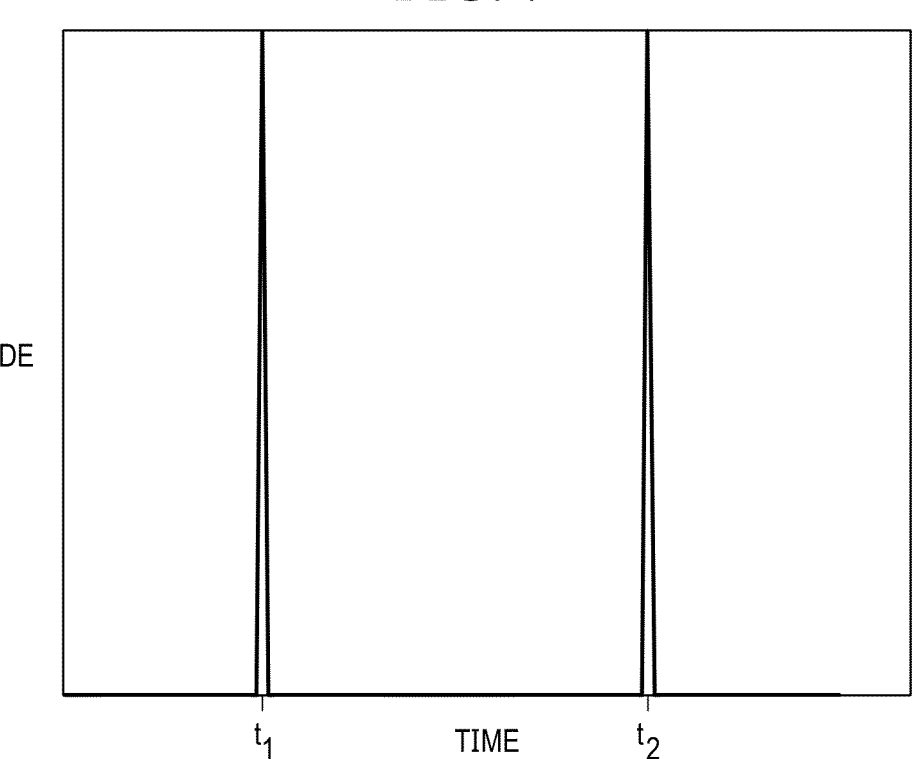
FIG. 7 illustrates an example graph depicting example tap delays used when two tap pairs are enabled, in accordance with embodiments of the present disclosure.

For example, as shown by the impulse response function of FIG. 7, when enabling two pairs of parallel taps (which may correspond to the lowest non-zero analog gain setting for DAC 14), control circuitry 20 may enable two tap pairs: one tap pair in the first group having a delay of $t_1$ and another tap pair in the second group having a delay of $t_2$. As shown in the impulse response function of FIG. 8, to increase analog gain by the lowest minimal amount above that shown in FIG. 7, control circuitry 20 may enable an additional two tap pairs: one tap pair having the lowest delay greater than $t_1$ and another tap pair having the highest delay less than $t_2$, such that the difference between the centers of the two groups slightly decreases, and the centers of the first group and the second group remain at approximately delays $t_1$ and $t_2$ (e.g., each center remains within the difference between delays $t_1$ and $t_2$ and the delays of their respective adjacent tap pairs). Moreover, as shown in the impulse response function of FIG. 9, to increase analog gain by the lowest minimal amount above that shown in FIG. 8, control circuitry 20 may enable an additional two tap pairs: one tap pair having the highest delay lower than $t_1$ and another tap pair having the lowest delay greater than $t_2$, such that the difference between the centers of the two groups slightly increases, and the centers of the first group and the second group approximately return to delays $t_1$ and $t_2$, respectively.

Figure 8:
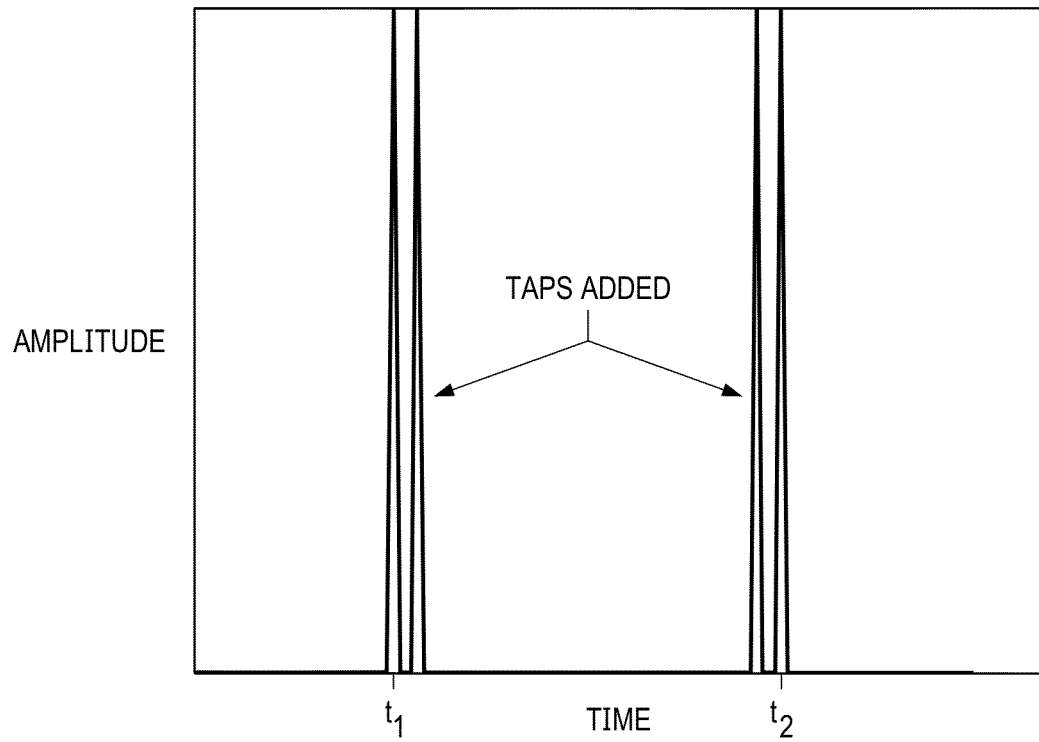
FIG. 8 illustrates an example graph depicting example tap delays used when four tap pairs are enabled, in accordance with embodiments of the present disclosure.
Figure 9:
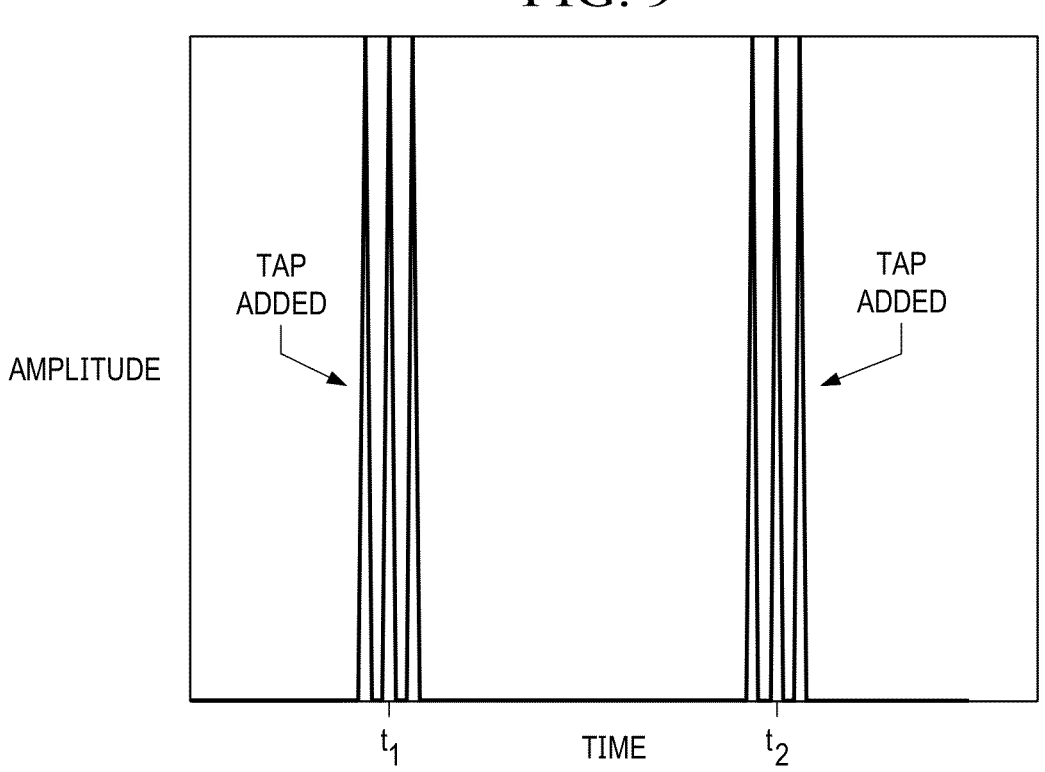
FIG. 9 illustrates an example graph depicting example tap delays used when six tap pairs are enabled, in accordance with embodiments of the present disclosure.

Although the foregoing contemplates addition of two tap pairs to decrease the duration between centers of the first group and second group in FIG. 8 followed by addition of two tap pairs to increase the duration between centers of the first group and second group in FIG. 9, in some embodiments, control circuitry 20 may alternatingly enable tap pairs in the opposite order—to first increase duration between centers of the first group and second group and then to decrease duration between centers of the first group and second group.

Although the delays $t_1$ and $t_2$ selected by control circuitry 20 as the centers of the first group and second group, respectively, may be of any suitable delay duration, in some embodiments, control circuitry 20 may set delays $t_1$ and $t_2$ at 25% and 75%, respectively, of the pulse width of modified digital input signal DIG_IN'.

Although FIGS. 7 through 9 contemplate system states in which an even number of taps are active at a given time, the systems and methods disclosed herein refer to system states in which an odd number of taps are active at a given time, in which the odd number of taps include pairs of active taps as described above, as well as an additional tap active at a delay duration which is at the average (e.g., at 50% of the pulse width of modified digital input signal DIG_IN') of the pairs of active taps.

Figure 10:
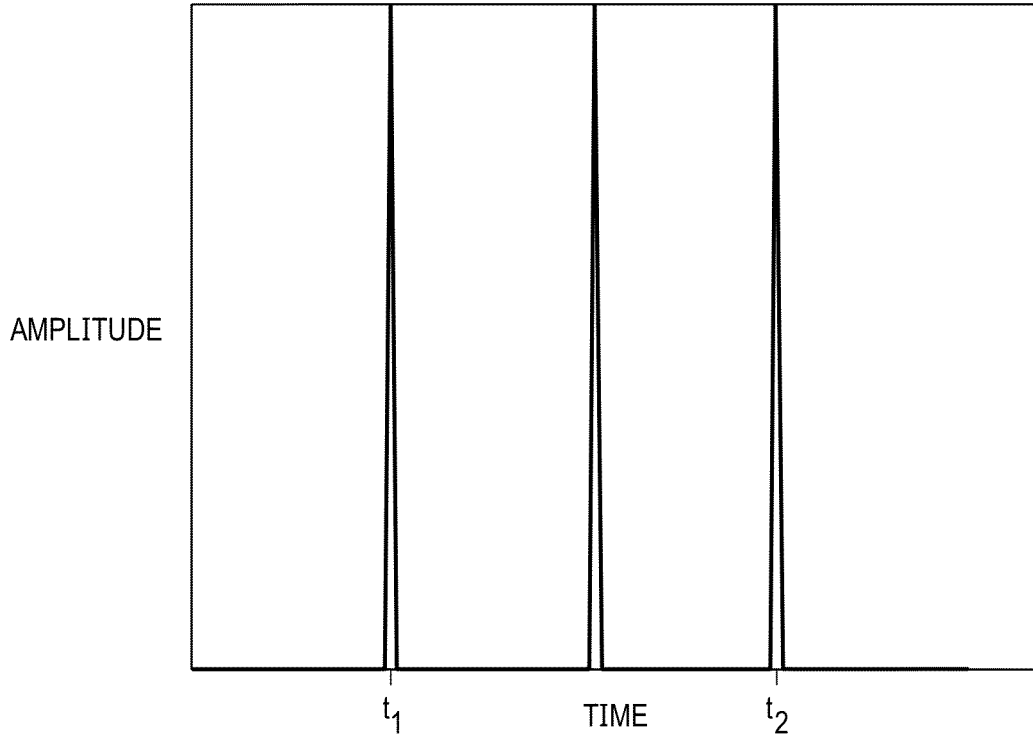
FIG. 10 illustrates an example graph depicting example tap delays used when three tap pairs are enabled, in accordance with embodiments of the present disclosure.
Figure 11:
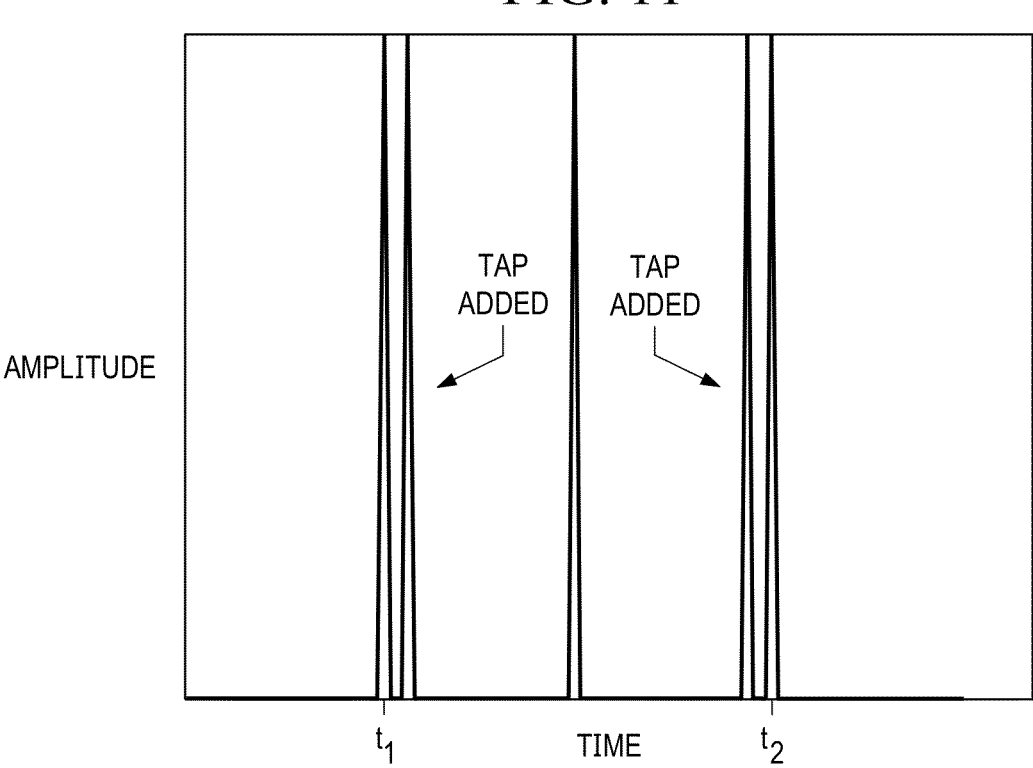
FIG. 11 illustrates an example graph depicting example tap delays used when five tap pairs are enabled, in accordance with embodiments of the present disclosure.
Figure 12:
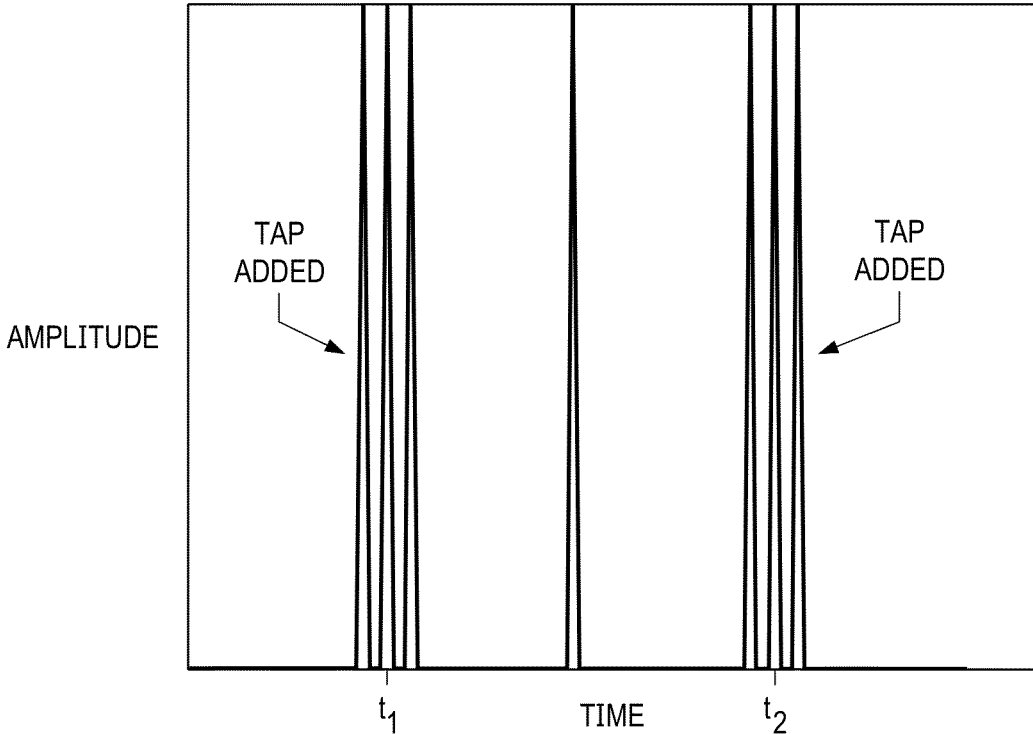
FIG. 12 illustrates an example graph depicting example tap delays used when seven tap pairs are enabled, in accordance with embodiments of the present disclosure.

To illustrate, as shown by the impulse response function of FIG. 10, when enabling two pairs of parallel taps (which may correspond to the lowest non-zero analog gain setting for DAC 14), control circuitry 20 may enable two tap pairs: one tap pair in the first group having a delay of $t_1$ and another tap pair in the second group having a delay of $t_2$, as well as a single tap in neither of the first group nor the second group, and having a delay of to which equals the average of delays $t_1$ and $t_2$. As shown in the impulse response function of FIG. 11, to increase analog gain by the lowest minimal amount above that shown in FIG. 10, control circuitry 20 may enable an additional two tap pairs: one tap pair having the lowest delay greater than $t_1$ and another tap pair having the highest delay less than $t_2$, such that the difference between the centers of the two groups slightly decreases, and the centers of the first group and the second group remain at approximately delays $t_1$ and $t_2$ (e.g., each center remains within the difference between delays $t_1$ and $t_2$ and the delays of their respective adjacent tap pairs). Moreover, as shown in the impulse response function of FIG. 12, to increase analog gain by the lowest minimal amount above that shown in FIG. 11, control circuitry 20 may enable an additional two tap pairs: one tap pair having the highest delay lower than $t_1$ and another tap pair having the lowest delay greater than $t_2$, such that the difference between the centers of the two groups slightly increases, and the centers of the first group and the second group approximately return to delays $t_1$ and $t_2$, respectively.

Further, although the foregoing contemplates the use of a differential input signal and pairs of differential gain taps, the systems and methods exemplified by FIGS. 4 through 12 and the description thereof may also be applied to an input network of a plurality of single-ended taps each having a delay, including each of the single-ended taps having a different delay.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A digital-to-analog converter, comprising:
   an integrator;
   an input network comprising a plurality of parallel taps, each member of the plurality of parallel taps having a signal delay such that at least two of the signal delays of the members of the plurality of parallel taps are different, and wherein each member of the plurality of parallel taps is coupled between an input of the digital-to-analog converter and an input of the integrator; and
   control circuitry configured to selectively enable and disable particular members of the plurality of parallel taps in order to program an effective input resistance of the input network to control an analog gain of the digital-to-analog converter, such that the control circuitry enables, substantially contemporaneously, an even number of members at a time in order to increase the analog gain, with half of such enabled members in a first group and half of such enabled members in a second group.

2. The digital-to-analog converter of claim 1, wherein the first group and the second group are separated temporally from each other in terms of their respective signal delays in order to facilitate matching of an input signal received by the digital-to-analog converter and an output of a component downstream of the digital-to-analog converter.

3. The digital-to-analog converter of claim 1, wherein the control circuitry is further configured to, when enabling or disabling additional members of the plurality of parallel taps to modify an analog gain, alternate between tap delays that decrease a duration between a first center of the first group and a second center of the second group and tap delays that increase the duration.

4. The digital-to-analog converter of claim 3, wherein the control circuitry is further configured to maintain the first center at approximately 25% of a pulse width of an input signal received by the digital-to-analog converter and at approximately 75% of a pulse width of the input signal.

5. A method comprising, in a digital-to-analog converter having an integrator and an input network comprising a plurality of parallel taps, each member of the plurality of parallel taps having a signal delay such that at least two of the signal delays of the members of the plurality of parallel taps are different, and wherein each member of the plurality of parallel taps is coupled between an input of the digital-to-analog converter and an input of the integrator:

selectively enabling and disabling, substantially contemporaneously, particular members of the plurality of parallel taps in order to program an effective input resistance of the input network to control an analog gain of the digital-to-analog converter, such an even number of members are enabled at a time in order to increase the analog gain, with half of such enabled members in a first group and half of such enabled members in a second group.

6. The method of claim 5, wherein the first group and the second group are separated temporally from each other in terms of their respective signal delays in order to facilitate matching of an input signal received by the digital-to-analog converter and an output of a component downstream of the digital-to-analog converter.

7. The method of claim 5, further comprising to, when enabling or disabling additional members of the plurality of parallel taps to modify an analog gain, alternating between tap delays that decrease a duration between a first center of the first group and a second center of the second group and tap delays that increase the duration.

8. The method of claim 7, further comprising maintaining the first center at approximately 25% of a pulse width of an input signal received by the digital-to-analog converter and at approximately 75% of a pulse width of the input signal.

* * * * *